(12) United States Patent
Kohonen

(10) Patent No.: US 6,546,615 B1
(45) Date of Patent: Apr. 15, 2003

(54) EMBOSSING TOOL FOR CIRCUIT BOARD HOLDERS HAVING A WORKING FACE WITH AN H-SHAPED FORMATION, AND METHOD OF MAKING CIRCUIT BOARD HOLDERS USING SUCH TOOL

(75) Inventor: Petri Kohonen, Vantaa (FI)

(73) Assignee: Tellabs Oy, Espoo (FI)

( * ) Notice: Subject to any disclaimer, the term of this patent is extended or adjusted under 35 U.S.C. 154(b) by 0 days.

(21) Appl. No.: 09/719,275

(22) PCT Filed: Jun. 15, 1999

(86) PCT No.: PCT/FI99/00521

§ 371 (c)(1), (2), (4) Date: Feb. 9, 2001

(87) PCT Pub. No.: WO99/66771

PCT Pub. Date: Dec. 23, 1999

(30) Foreign Application Priority Data

Jun. 16, 1998 (FI) .................................................. 981393

(51) Int. Cl.[7] ................................................ B23P 19/00
(52) U.S. Cl. ......................... 29/650; 29/432; 29/432.1; 29/DIG. 37; 361/752; 361/796; 361/736; 361/737; 361/748
(58) Field of Search ................................ 361/796, 802, 361/752, 807, 756, 736, 737, 748; 29/432, 432.1, DIG. 37, 650

(56) References Cited

U.S. PATENT DOCUMENTS

| | | |
|---|---|---|
| 3,470,420 A | 9/1969 | Marks |
| 4,184,599 A | 1/1980 | Drake et al. .................. 211/41 |
| 4,496,616 A * | 1/1985 | McLoughlin et al. ...... 428/34.9 |
| 4,519,016 A * | 5/1985 | Bradley et al. ............. 361/415 |
| 4,602,829 A * | 7/1986 | De Andrea .................. 312/320 |
| 4,866,576 A | 9/1989 | Umentsu et al. |
| 5,044,506 A * | 9/1991 | Brown ......................... 211/41 |
| 5,394,305 A | 2/1995 | Moral et al. |

FOREIGN PATENT DOCUMENTS

| | | |
|---|---|---|
| DE | 2 137 027 | 2/1973 |
| DE | 30 23 085 | 1/1981 |
| GB | 2.230.649 A | 10/1990 |
| JP | 1-318294 | 12/1989 |
| JP | 6-275970 | 9/1994 |
| JP | 9-83161 | 3/1997 |

\* cited by examiner

Primary Examiner—David Martin
Assistant Examiner—Thanh Y. Tran
(74) Attorney, Agent, or Firm—Hogan & Hartson, LLP

(57) ABSTRACT

A tool used in manufacturing circuit board holders from sheets of material has a working face for forming embossments on the sheets by repetitively striking the sheets therewith. The working face includes an H-shaped formation for forming two separate halves of an embossment on the sheet of material with one strike, of which, of the two separate halves, one is delimited by the upper parallel lines of the H and the other is delimited by the lower parallel lines of the H. In a method using such tool, the sheet of material is struck once with the tool, the working face of the tool is moved relative to the sheet in a direction of the parallel lines of the H by a predetermined distance, and the sheet material is again struck with the working face of the tool so that an embossment is formed on the sheet which is delimited by a pattern left on the sheet of material by the parallel lines of the H pointing in one direction at the first strike and by a pattern left on the sheet of material by the parallel lines of the H pointing in the other direction at the second strike.

5 Claims, 6 Drawing Sheets

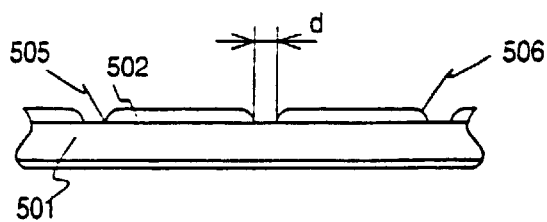 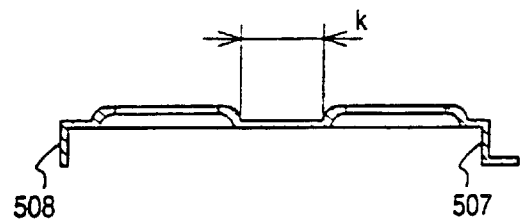
Fig. 5a    Fig. 5c
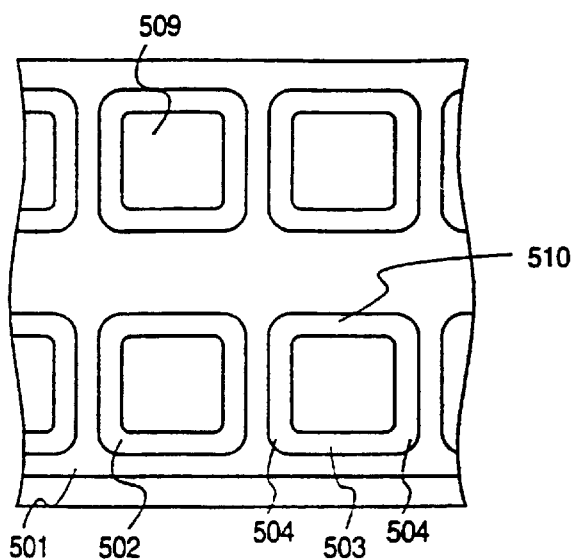
Fig. 5b
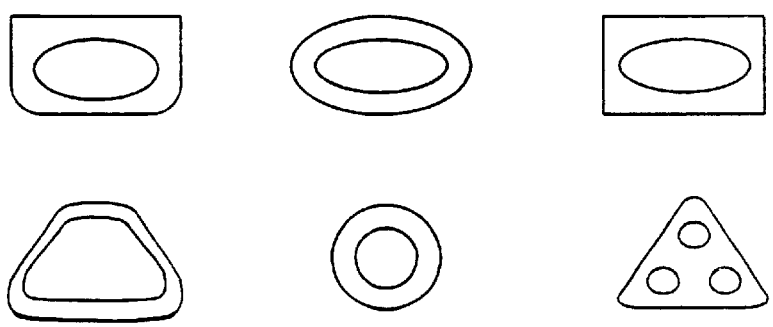
Fig. 6

US 6,546,615 B1

EMBOSSING TOOL FOR CIRCUIT BOARD HOLDERS HAVING A WORKING FACE WITH AN H-SHAPED FORMATION, AND METHOD OF MAKING CIRCUIT BOARD HOLDERS USING SUCH TOOL

CROSS-REFERENCES TO RELATED APPLICATIONS

Not Applicable

STATEMENT REGARDING FEDERALLY SPONSORED RESEARCH OR DEVELOPMENT

Not Applicable

Reference to a "Microfiche-Appendix"

Not Applicable

BACKGROUND OF THE INVENTION

1. Field of the Invention

In general the invention relates to fastening circuit boards to an electronic device. In particular the invention relates to a rack with board holders, which is used for fastening circuit boards by sliding them on place between board holders in a direction which is parallel with two edges of the circuit board. In addition, the invention relates to a device and a method for manufacturing board holders to a rack.

2. Description of the Related Art

Many modern electronic devices are mounted in a rack, whereby a typical prior art construction follows the principle shown in FIG. 1. A rack includes board holders fastened to horizontal shelves or vertical walls, between which the edges of the circuit board 100 are placed. In FIG. 1, the board holders are fastened to horizontal shelves, whereby there is a lower holder 101a for the lower edge of a board on the lower shelf, and an upper holder 101b for the upper edge on the upper shelf. There are connectors 102 on the board on the edge which goes in first when the board is pushed in place. The back wall of the rack is formed by the mother board 103, on which there are counterparts 104 for the connectors. When the card is pushed in place, the connectors 102 meet the counterparts 104, whereby the card is electrically connected to the mother board and through it to other boards of the same device. The number of boards in a certain device can be selected when the device is designed. Often the devices form families in which mother boards which are similar or nearly similar can be provided with a smaller number of boards for implementing a simple version, or with a larger number of boards for implementing a more versatile version.

Some prior art board holders will be briefly described in the following. FIG. 1 shows separate board holders 101a and 101b made of metal or plastic, which are fastened to a shelf (or wall) generally by means of bungs or screws. They have the drawback that they are separate parts, and their number, dimensioning and other properties must be compatible with both the boards and the shelves, which causes a logistic problem in the assembly of the devices. FIG. 2 shows board holders used in connection with shelves made of metal sheet, which are bent of the shelf metal. The board holder 201 comprises two tongues 201a and 201b reaching outward from the level of the shelf surface, which are formed by making a die cut shaped like a wide H, from which the rectangular areas that remain between the lines of the H are bent about 90 degrees around an imaginary axis which combines the ends of the vertical lines of the H. Many consecutive board holders like this can be formed to support the edge of one card. These board holders have the drawback of sharp edges, which can damage the card or injure the fingers of the person who assembles or services the device. The other type of board holder shown in FIG. 2 consists of two elongated, raised pieces of metal sheet 202a and 202b, which are formed by making four parallel, straight cuts on the shelf metal. The area between two adjacent cuts is forced to an upraised position. These upraised strips are arranged in consecutive pairs, whereby the edge of the card is always placed between two adjacent strips. In this type of board holder the edges can also remain dangerously sharp. In addition, the board holders shown in FIG. 2 have the drawback that both the upper and lower edge of the board do not always settle easily between the holders, but a part of the board may remain outside the holder, whereby the assembly of the device does not succeed.

An American registered design document number Des. 380,455 discloses a board holder according to FIG. 3, design protected by Metro Industries Inc., which is intended for use as the wall of a transport and storage shelf on which circuit boards are stored and/or transported during manufacture. The whole wall surface is covered by embossments 301 formed at regular distances, the shape and mutual placement of which is such that the board can be pushed on place either horizontally (arrow 302), diagonally downwards (arrow 303) or diagonally upwards (arrow 304). A solution of the same type is known from the U.S. Pat. No. 4.382,517. This solution is shown in FIG. 4. The surface of the wall panel comprises a number of diamond-shaped embossments 401, which form diagonal grooving on the whole wall surface for the edged of the boards. In the board holders shown in FIGS. 3 and 4, both the problem of separate parts and sharp edges have been solved, but the solutions are not suitable as board holders of racks, because they would require either a diagonally placed mother board or counterparts for the board connectors fastened diagonally on the mother board, and these are not known in the prior art. If it were assumed by way of example that the solutions were suitable for racks, there would also be the problem that when the grooves are near each other, it is possible to push the card into the wrong groove by accident, and that would damage the connection between the board and the mother board. There will also be the problem of insufficient bending stiffness of a shelf with board holders, if the solution shown in FIG. 3 or 4 were used on a shelf surface instead of a wall surface. Many boards with their components can be rather heavy, and if there are, for example, over 20 boards on a shelf which is 60 cm wide, their weight easily bends the lower shelf to an arched shape, whereby the upper edges of the boards in the middle may be detached from the upper holders. It would also be difficult to add ventilation holes to the board holders shown in the FIGS. 3 and 4 to ensure sufficient circulation of cooling air.

It is an objective of the present invention to provide a rack with board holders which can be manufactured by simple methods, which is safe in use and in which it is difficult to install the boards incorrectly. It is also an objective of the invention that the board holder would contribute to making the rack more rigid. In addition, it is an objective of the invention that a rack made according to it can easily be scaled to provide different distances between boards. Furthermore, it is an objective of the invention that the rack can have both board holders and ventilation holes.

BRIEF SUMMARY OF THE INVENTION

The objectives of the invention are achieved by forming bubble-like embossments on the shelf or wall material, between which there are depressions for the edges of the board and which have two parallel edges in a direction which differs substantially from the direction intended as the direction of the edge of the board.

The rack according to the invention is characterized in that in order to support the first edge of the circuit boards, the first level surface of the rack comprises protruding embossments of the same material as the level surface, whereby the first embossment is between the point intended to support the first edge of the first circuit board and the point intended to support the first edge of the second circuit board, and that the extent of the embossment, perpendicular to the surface of the circuit boards, is the same as the distance between the circuit boards, and that the embossment has two parallel edges the direction of which differs substantially from the direction which is the intended direction of the first edge of the circuit boards.

The invention also relates to a device for manufacturing a board holder. The device according to the invention is characterized in that its working surface comprises a formation shaped like the letter H for forming two halves of an embossment delimited by the lines of the H on a level surface at one strike.

In addition, the invention relates to a method for manufacturing a board holder. The method according to the invention is characterized in that the working surface used in it comprises a formation shaped like an H, in which there are two parallel lines pointing in one direction, two parallel lines pointing in the opposite direction and a transverse line between the parallel lines pointing in opposite directions, whereby the method comprises striking the level surface with the working surface once, moving the working surface in relation to the level surface in the direction of the parallel lines of the H for a predetermined distance, and striking the level surface with the working surface again, whereby an embossment is formed on the level surface, delimited by the pattern left on it by the parallel lines of the H pointing in one direction at the first strike and by the pattern left on it by the parallel lines of the H pointing in the other direction at the second strike.

According to the invention, bubble-like embossments are formed on the shelf or wall of a rack at regular distances. The distances between the embossments are made such that the edge of a board having a certain thickness can be placed between two adjacent embossments. The width of the embossments corresponds to the distance between two adjacent boards used in the device, whereby no such point where the edge of the board might stay in the wrong position remains beside any board holder (between the embossments). The height of the embossments from the surface of the shelf is selected such that a bend of an assumed magnitude in the lower shelf is not sufficient to release the upper edge of the boards in the middle of the shelf from the embossments which act as the board holders above.

The preferred material for the shelf is stainless steel, which provides many advantages. A shelf made of stainless steel has excellent corrosion resistance. In addition, forming bubble-like embossments by forcing causes work hardening in stainless steel, and thereby improves the rigidity of the shelf. According to the invention, the bubble-like embossments extend over a substantial part of the width of the shelf, whereby the profile of the edges of the bubble-like embossments makes the shelf more rigid especially because of the work hardening but also because of its shape.

The bubble-like embossments according to the invention are formed on the shelf preferably with a tool which has an H-shaped working surface. This provides the advantage that the same tool can be used to form bubble-like embossments of different widths, or board holders suitable for different distances between boards by moving the tool for making the adjacent embossments for a distance in which the parallel lines of an H-shaped working surface partially overlap in two successive shaping steps. The manufacturing costs of a tool like this are considerable, and therefore is particularly advantageous that different tools need not be manufactured for different distances between boards.

The middle part of a bubble-like embossment according to the invention can be removed, whereby the hole provides ventilation. This does not have a considerable negative effect on the above mentioned advantageous features of the inventions, such as the rigidity of the shelf.

BRIEF DESCRIPTION OF THE SEVERAL VIEWS OF THE DRAWING

In the following, the invention will be described in more detail with reference to the examples of preferred embodiments and the accompanying drawings, in which FIGS. 5a, 5b and 5c show a board holder according to the invention, FIG. 6 shows some variations of the shape shown in the FIGS. 5a to 5c.

DETAILED DESCRIPTION OF THE INVENTION

Figure 1:
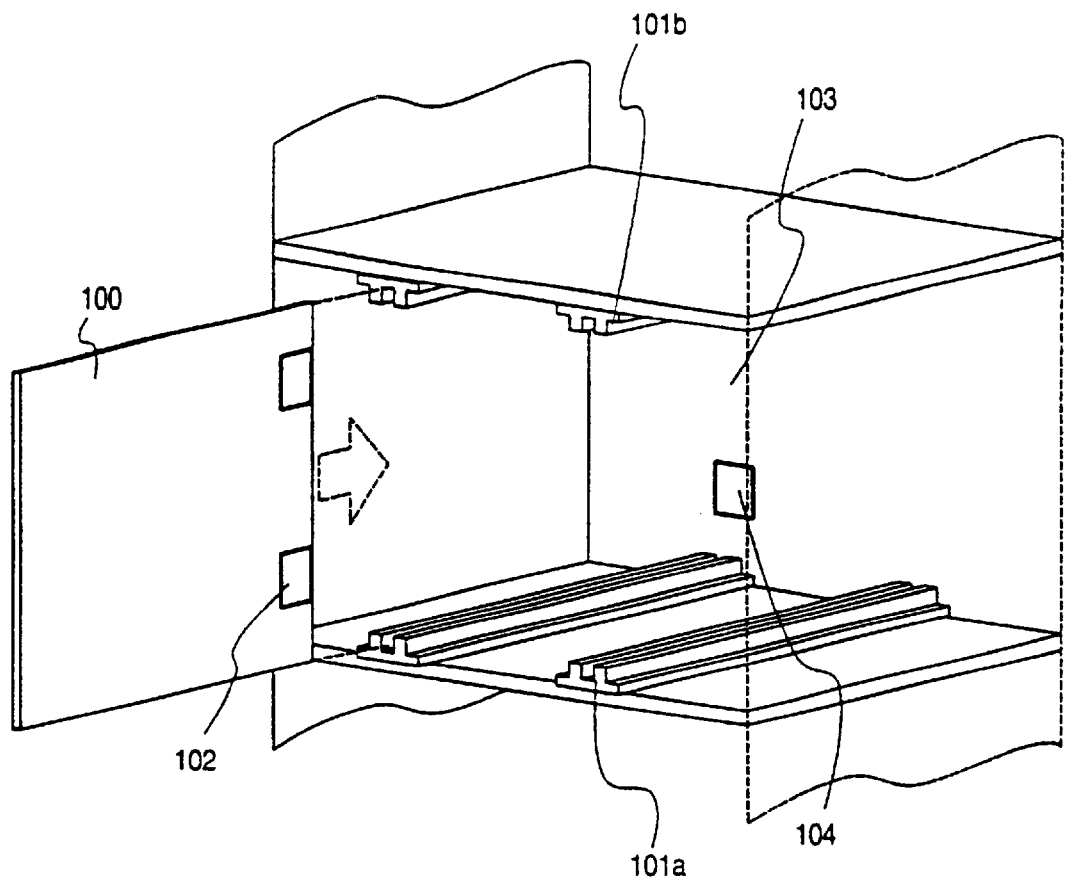
FIG. 1 shows a prior art rack and board holder.
Figure 2:
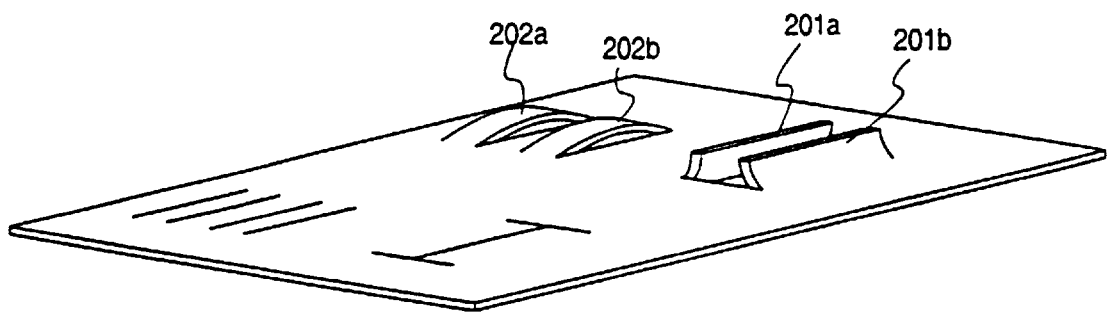
FIG. 2 shows some prior art board holders.
Figure 3:
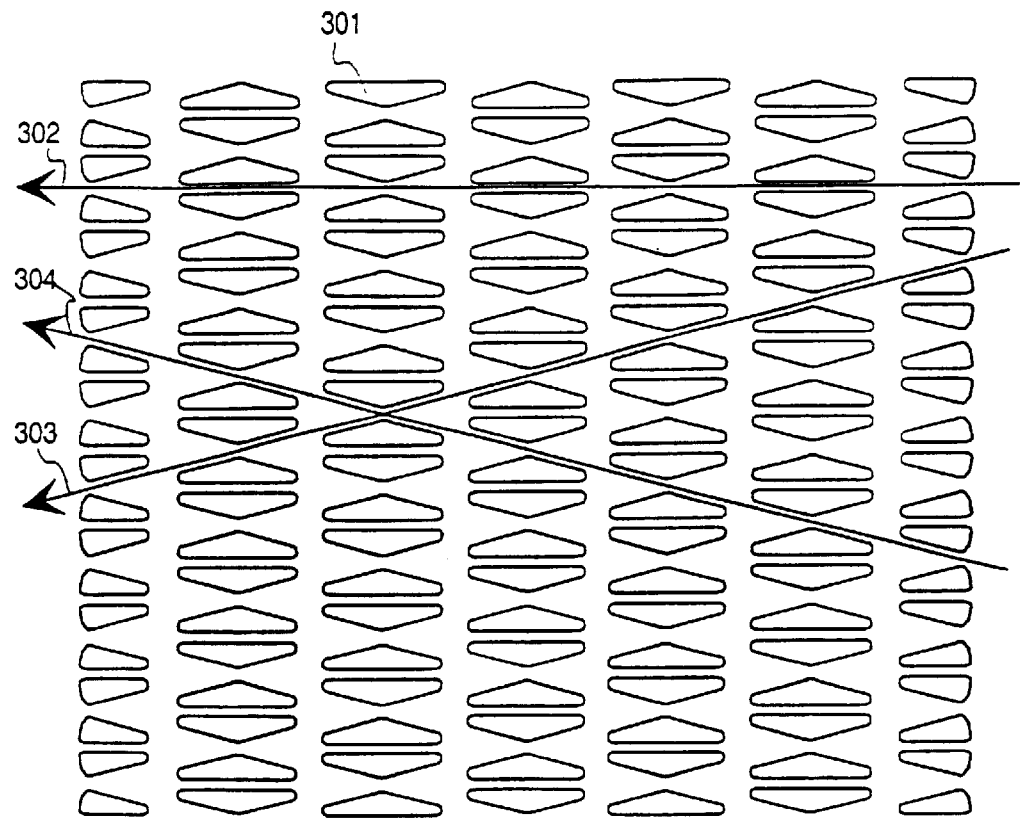
FIG. 3 shows another prior art board holder.
Figure 4:
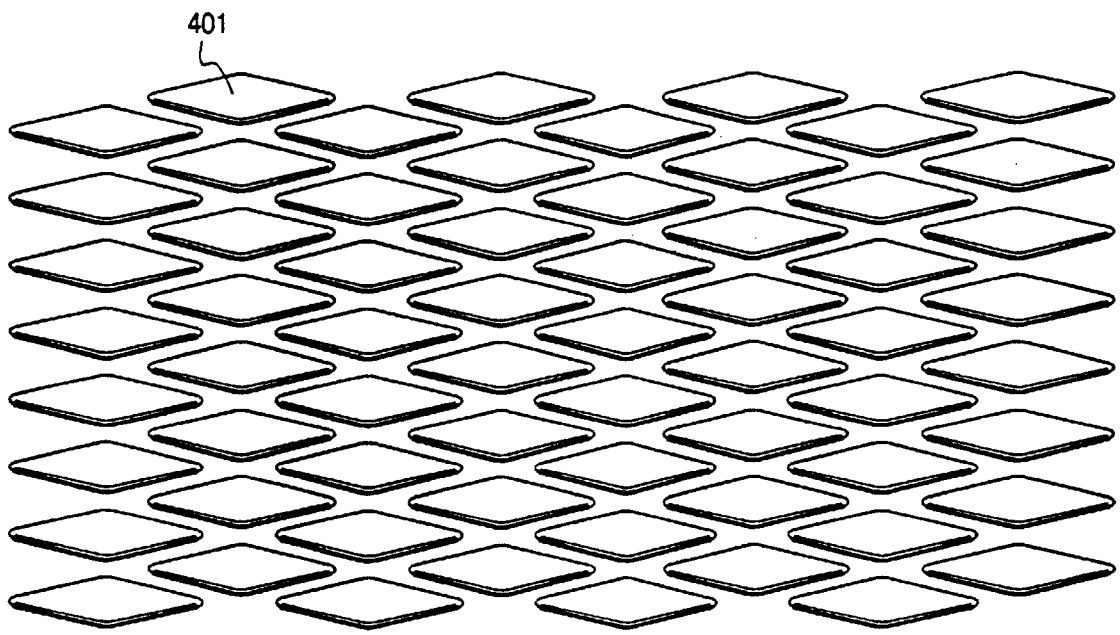
FIG. 4 shows yet another prior art board holder.

Above in connection with the description of the prior art reference was made to FIGS. 1–4, and in the next description of the invention and its preferred embodiments reference will be made mostly to FIGS. 5a–10. In the figures, the same reference numbers are used for corresponding parts.

FIGS. 5a, 5b and 5c show a part of the rack or wall 501 seen from the front (FIG. 5a), from above (FIG. 5b) and from the side (FIG. 5c). For shortness, the following description will concentrate on a shelf on which the boards are placed in a vertical position, but it will be clear to a person skilled in the art that the board holders can also be formed on the walls of the rack, whereby the boards would be placed in a horizontal position. According to the invention, a number of bubble-like embossments 502 are formed on the shelf. Adjacent embossments mean two embossments which are side by side at the same distance from the front edge of the shelf. Consecutive embossments mean two embossments on the same imaginary line which is perpendicular to the front edge of the shelf. The distance d between two adjacent embossments is the same as the thickness of the edge of a board which is intended to be installed by using the board holders according to the invention, added by a certain tolerance, which can be specified by testing; one suitable tolerance is 0.6 mm. The distance k between consecutive embossments is not important for the invention. It is advantageous to make at least two rows of consecutive embossments on the shelf to provide support for the edge of the board on at least two points, but this is not necessary. If the boards are small and/or the embossments reach over a relatively large part of the shelf in the direction perpendicular to the front edge of the shelf (at least a third of the length of the board), consecutive embossments are not needed.

FIGS. 5a, 5b and 5c show a shape of the edges of the bubble-like embossments, which is advantageous for the invention but not limiting. Seen from above, the bubble-like embossments are shaped like squares with rounded corners, which shape provides many advantages. In the first place, the edge 503 of such an embossment at the side of the front edge of the shelf covers the space between two adjacent board places entirely, whereby it is not possible to put the board in any other places than the ones determined by the board holders. This ensures that the connectors of each board meet the counterparts on the mother board directly and safely. It is advantageous that the corners 504 on the side of the front edge of the shelf are rounded, because they guide the board pushed between the embossments easily on place. It is also advantageous that those of the consecutive embossments which are further from the front edge of the shelf have rounded corners at least on the side of the front edge of the shelf for the above mentioned reason: when the board is pushed on place, it is easily placed a little askew at first, but the rounded corners of the next embossment help to straighten the board and place it correctly. In addition, the rounded corners provide a finished impression and they do not damage the boards or injure the fingers of the person handling them. The fact that the two sides 503 and 510 of the embossment, which differ substantially from the intended direction of the edge of the circuit board are parallel, also has an important advantage, which will be dealt with later in connection with the description of the manufacturing method.

Seen from the front and the sides, the edges of the bubble-like embossments shown in FIGS. 5a–5c are shaped so that they rise from the level of the surface of the shelf in about a 90 degree angle at first but are then rounded towards a horizontal direction. Seen from the front or the side, the bubble-like embossment looks like a letter D, the rounded part of which is pointed at right angles outward from the surface of the shelf and elongated in the direction of the shelf surface. This shape also provides some advantages. The sharp angle 505 to the surface of the shelf ensures that it is easy to slide the board between two adjacent embossments, because the edge of the board lies against the even part which remains between the embossments. On the other hand, the rounding 506 at the upper edges of the embossments is advantageous for the safety of operation, because a rounded edge does not damage the boards or injure the fingers of the installer. The profile formed by the edge of the embossment has a stiffening effect on the shelf, whereby it does not bend easily even if many heavy boards were placed on it. The profile formations 507 and 508 in the direction of the front edge of the shelf also contribute to making the shelf more rigid. The invention does not limit the formation of the shelf in addition to the manufacture of board holders according to the invention.

In FIGS. 5a–5c, a ventilation hole 509 is formed in the middle of each embossment. Each embossment reaches almost from one circuit board to another in the direction of the front edge of the shelf. This makes the ventilation hole in the middle of the embossment rather large, which contributes to efficient ventilation. The ventilation hole could also be round, oval or consist of many smaller holes. The invention does not limit the size, shape or number of ventilation holes formed in the middle of the embossment and does not even require that there should be ventilation holes in the embossments, but if implemented in the manner shown in FIGS. 5a to 5c, the board holders and ventilation holes support each other and ensure efficient ventilation. In the manufacturing process, the ventilation holes are preferably made before their edges are bent as the edges of the bubble-like embossments.

In addition to a square with rounded corners, other shapes shown in FIG. 6 can also be used as the basic forms of a bubble-like embossment and ventilation hole. In the figure it is assumed that the front edge of the shelf is at the bottom of the figure. However, the shapes where the bubble-like embossment does not comprise two parts of considerable length, which are substantially straight and parallel and the direction of which differs considerably of the intended direction of the edge of the circuit board do not provide the advantage of scalability, which will be described in the following description of the manufacturing tool and method.

It is also possible to form ventilation holes in other parts of the shelf than in the middle of the bubble-like embossments. In one preferred embodiment of the invention there are as many ventilation holes placed between the consecutive bubble-like embossments as is possible without substantially reducing the strength of the shelf. A suitable size and number of ventilation holes can then be found by testing.

Figure 7:
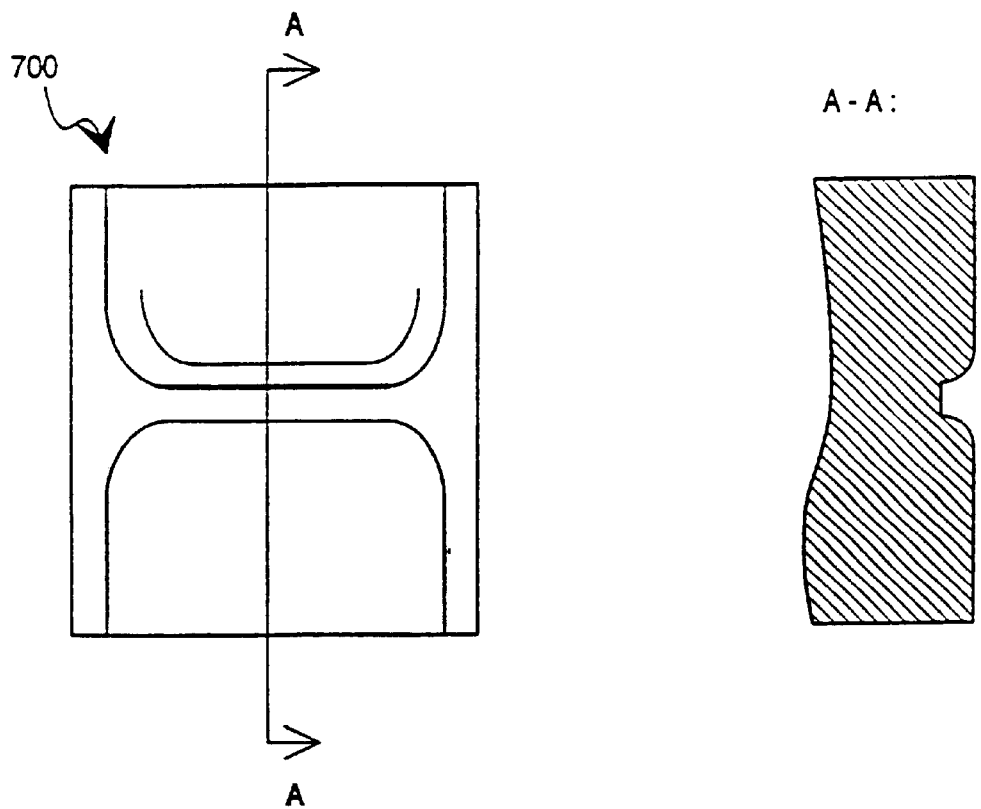
FIG. 7 shows a tool according to the invention.

FIG. 7 shows the working surface of a tool according to the invention which is particularly suitable for the manufacture of board holders according to the invention in which the shape of the embossments comprises a part of considerable length and substantially in the direction of the front edge of the shelf. Here it is assumed that the embossments are shaped like squares rounded at the corners as shown in the FIGS. 5a to 5c. The embossments are preferably manufactured by forcing or pressing the board at the desired point with great force between two such tool pieces in which the working surfaces pressing against each other have complementary patterns. In view of the invention, it is sufficient to describe one of these tool pieces. This pressing or embossing is also called hammering.

Figure 8A:
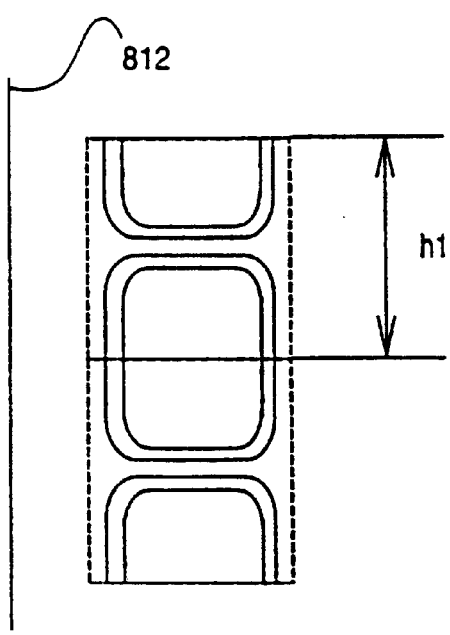
FIGS. 8a to 8d show the use of a tool according to the invention.
Figure 8B:
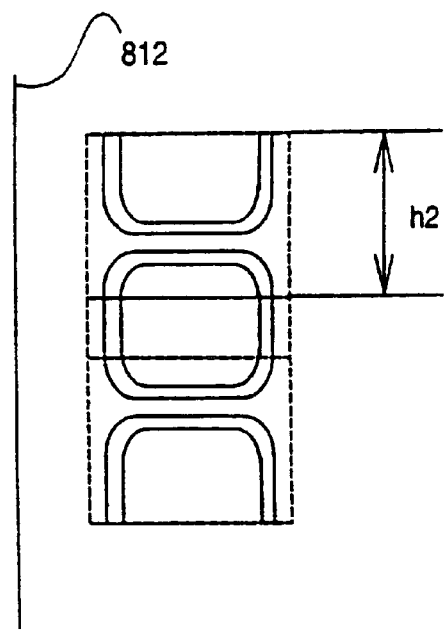

One alternative for forming bubble-like embossments on a metal sheet is to manufacture a convex tool of the shape and size of the bubble-like embossment, by means of which each embossment would be made separately. However, it will be seen from FIG. 7 that the tool 700 according to the preferred embodiment of the invention is based on a different principle. Its basic form is an H. In FIG. 7, the upper parallel lines of the H are as long as the lower parallel lines of the H, but this is not significant in view of the invention; the upper parallel lines can also have different length from the lower parallel lines. In addition, the upper parallel lines can be mutually of different length and so can also the lower parallel lines be, but it is nevertheless advantageous that the combined length of the upper and lower line on the right side is the same as the combined length of the upper and lower line on the left side. The transverse line in the middle of the H corresponds to the space between two adjacent bubbles, the width of which is marked with d in FIG. 5a. FIGS. 8a and 8b illustrate how the tool shown in FIG. 7 can be used to form bubble-like embossments of different sizes or board holders at different distances from each other. In FIG. 8a the tool is moved between strikes corresponding to adjacent embossments in the direction of the edge 812 of the shelf a distance h1, whereby in the latter strike the upper ends of the H of the tool hit exactly the same points where its lower ends were in the former strike. The result is a board holder with the largest distance between boards which can be made with the tool. The distance h1 is the same as the height of the H of the tool.

In FIG. 8b the tool is moved between strikes corresponding to adjacent embossments a distance h2, whereby in the latter strike the upper ends of the H of the tool hit the points where its lower ends started to turn towards the transverse line in the former strike. The adjacent strikes thus overlap for a distance (h1–h2). The result is a board holder with the smallest distance between boards which can be made with the tool. The distance h2 is the same as the height of the H of the tool reduced by the length of the upper or lower vertical line of the H in the direction in which the upper or lower vertical line is shorter.

Board holders for different distances between boards can be manufactured by selecting a distance between h1 and h2 as the transfer distance of the tool between strikes. The invention does not require that the distance between boards would be the same throughout the whole shelf. In practice, the shelves are manufactured in a sheet metal working centre, where the width of the embossments (the transfer distance of the tool between adjacent strikes) can vary even after each embossment. It is particularly advantageous that there is no need to change the tool when varying the distance but different distances between boards can be implemented simply by programming the desired transfer distances to the sheet metal working centre. One tool can be used to manufacture thousands of shelves before it must be sharpened, and after sharpening it can be used again for a long time.

Although the wording "moving the tool" was used in the above description, it is naturally also possible to keep the tool on place while the surface-being worked on is moved. In general, it can be stated that the tool is moved in relation to the surface being worked on, which definition covers all alternatives of moving the tool or the surface being worked on.

The distance between boards is somewhat dependent on the standard used in the dimensioning of the mother board. According to one standard, the basic measurement of the dimensioning of the mother board is a tenth of an inch (about 2.5 mm), whereby a suitable distancing of boards could be, for instance, one board per inch. According to another standard, in the mother board the basic measurement is millimetres and not parts of an inch, whereby a suitable distancing between boards could be one board per each 30 millimetres.

Figure 8C:
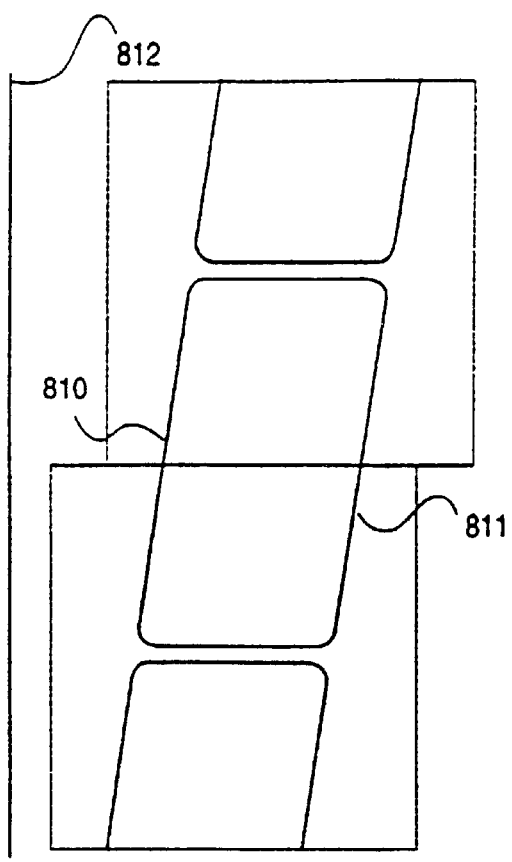
Figure 8D:
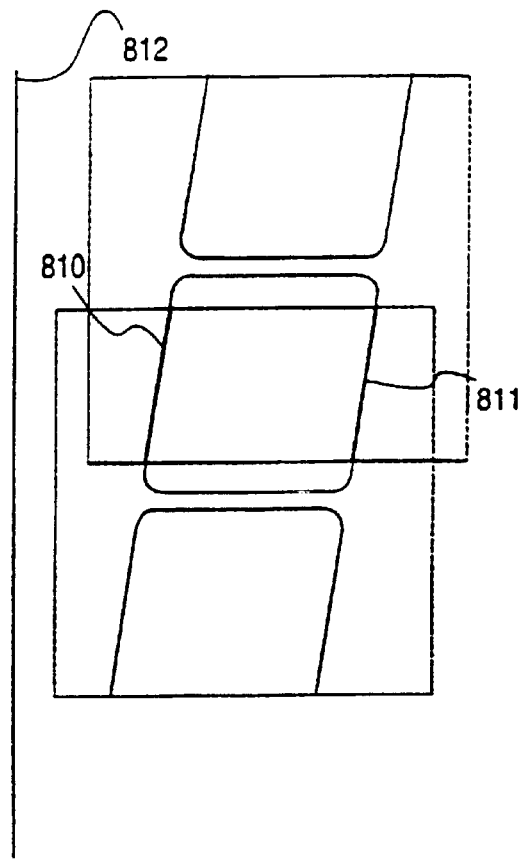

The fact that one tool can be used to make board holders for different distances between boards is called the advantage of scalability in this patent application. In order to achieve that, it is not essential that the parallel parts of the edges of the bubble-like embossments should have the same direction as the front edge of the shelf: it is sufficient that they differ substantially from the intended direction of the edge of the circuit board. FIGS. 8c and 8d show the manufacture of bubble-like embossments for different distances between boards where the parallel sides 810 and 811 of the embossments are at skew angles to the front edge 812 of the shelf. Then the manufacturing tool must be moved between adjacent strikes in some other direction than the direction of the front edge of the shelf, and the adjacent bubble-like embossments are not at equal distances from the front edge of the shelf.

Figure 9:
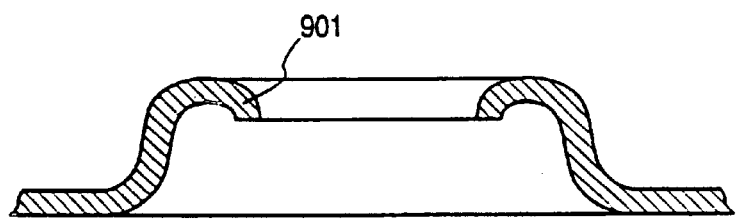
FIG. 9 shows a variation of the shape shown in the FIGS. 5a to 5c.

FIG. 9 is a cross-section of a bubble-like embossment, which provides even better rigidity than the above embodiments. In this embodiment, the edges 901 of the ventilation hole are bent towards the surface of the shelf. The more profiling is made on the edge of the bubble-like embossment and/or ventilation hole the more rigid it becomes, but then the shape of the tool used in the manufacture also becomes more complicated.

Figure 10:
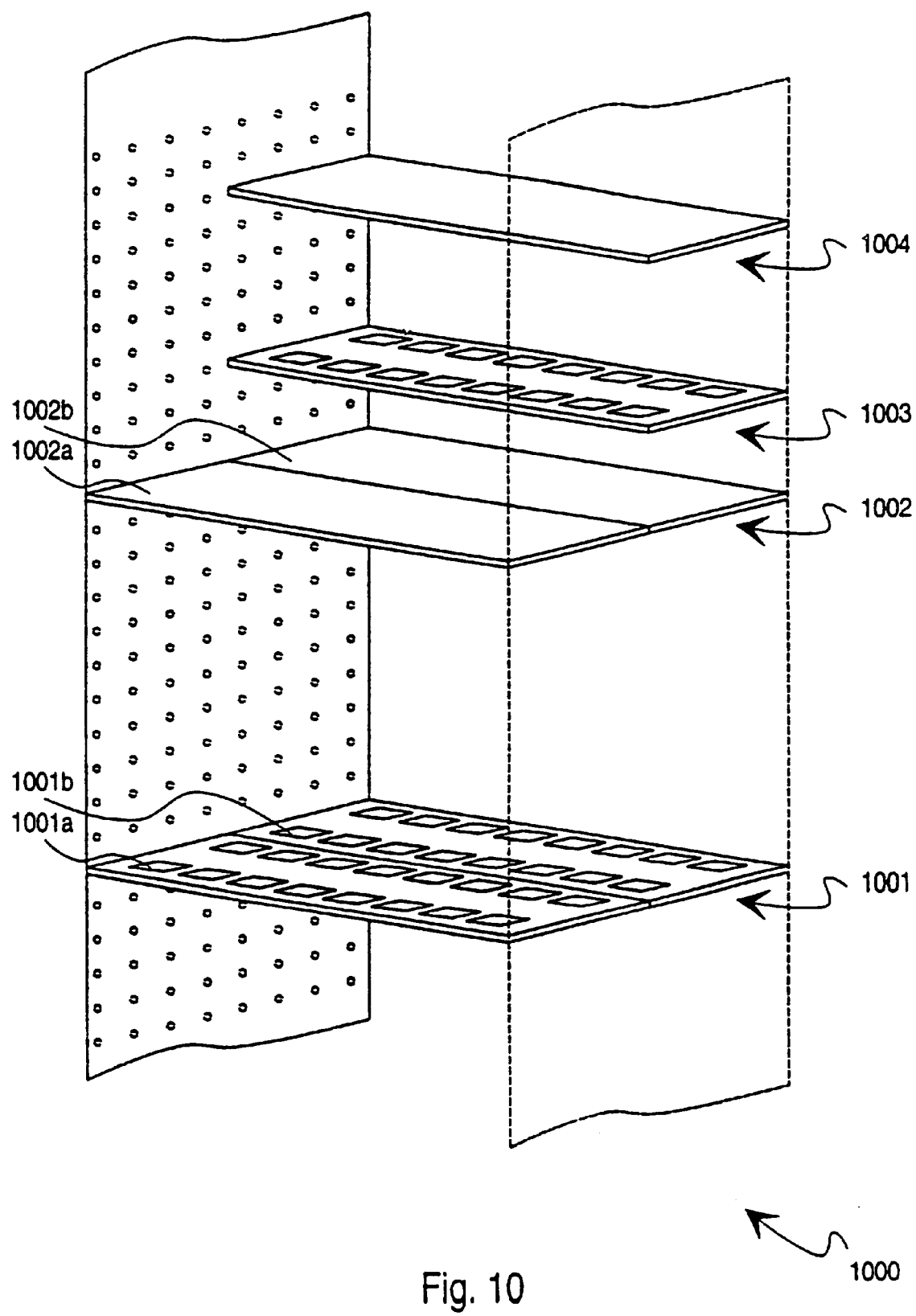
FIG. 10 shows a rack according to the invention.

FIG. 10 shows a device rack 1000, in which shelves with board holders according to the invention are used. The mother boards or other boards are not shown in FIG. 10. In different devices the boards can be of different sizes, and that can be provided for in the invention in many ways. One way is to use modular construction in the shelf of the rack, whereby one shelf can consist of one or more consecutive modules. In FIG. 10 a shelf 1001 and a corresponding upper shelf 1002, on which the upper edge of the boards placed on shelf 1001 is supported and on which the board holders are on the lower surface consist of a front part 1001a (1002a) and a back part 1001b (1002b). The upper shelves in the same rack are intended for shorter boards, whereby the shelves 1003 and 1004 consist of only one shelf module. The shelves are fastened to the walls 1005 and 1006 preferably with screws or pop rivets. Boards of different sizes can be provided for by making holes in the walls at different heights, whereby the vertical distance between shelves can be selected according to the size of boards to be installed between them.

What is claimed is:

1. A method for manufacturing a circuit board holder from a sheet of material for positioning to define a level surface in a rack, the method comprising the steps of:

striking the sheet of material once with a working face that has an H-shaped formation in which there are two parallel lines pointing in one direction, two parallel lines pointing in the opposite direction and a transverse line between the parallel lines;

moving the working face relative to the sheet of material in a direction of the parallel lines of the H by a predetermined distance; and striking the sheet of material again with the working face so that an embossment is formed on the sheet of material, said embossment being delimited by a pattern left on the sheet of material by the parallel lines of the H pointing in one direction at the first strike and by a pattern left on the sheet of material by the parallel lines of the H pointing in the other direction at the second strike.

2. A method as claimed in claim 1, wherein the step of moving the working face relative to the sheet of material comprises moving the working face in relation to the sheet of material by a certain distance, which is as large as the extent of the H-shaped formation of the working surface from an end of a vertical line of the H in one direction to the end of the vertical line of the H in the other direction.

3. A method as claimed in claim 1, wherein the step of moving the working face relative to the sheet of material comprises moving the working face relative to the sheet of material by a certain distance, which is as large as the extent of the H-shaped formation of the working surface from an end of a vertical line of the H in one direction to the end of the vertical line of the H in the other direction, reduced by a length of the vertical line of the H in the direction in which a straight part of the vertical line of the H is the shortest.

4. A method is claimed in claim 1, comprising repeating the steps of moving the working face relative to the sheet of material and striking the sheet of material with the working face to form a plurality of board holders on the sheet of material, whereby the working face is always moved in relation to the sheet of material between consecutive strikes in the direction of the parallel lines of the H by the same predetermined distance.

5. A method is claimed in claim 1, wherein for forming a plurality of board holders on the sheet of material with varying distances between boards, the method comprises striking the sheet of material with the working face a plurality of times, whereby the working face is moved in relation to the sheet of material between consecutive strikes by a distance which, during the striking of one sheet of material gets a certain largest value and a certain smallest value, which largest value is at the most equal to the extent of the H-shaped formation of the working face from an end of a vertical line of the H in one direction to the end of the vertical line of the H in the other direction, the smallest value is at least equal to the extent of the H-shaped formation of the working face from an end of a vertical line of the H in one direction to the end of the vertical line of the H in the other direction, reduced by a length of the vertical line of the H in the direction in which a straight part of the vertical line of the H is the shortest.

* * * * *